(12) United States Patent
Baccini et al.

(10) Patent No.: US 10,103,283 B2
(45) Date of Patent: Oct. 16, 2018

(54) METHOD OF PRODUCTION OF BACK-CONTACT BACK-SHEET FOR PHOTOVOLTAIC MODULES

(71) Applicant: EBFOIL S.R.L., Bologna (IT)

(72) Inventors: Elisa Baccini, Carbonera (IT); Luigi Marras, Medea (IT); Bruno Bucci, Castenaso (IT)

(73) Assignee: EBFOIL S.R.L., Bologna (IT)

( * ) Notice: Subject to any disclaimer, the term of this patent is extended or adjusted under 35 U.S.C. 154(b) by 22 days.

(21) Appl. No.: 14/439,225

(22) PCT Filed: Oct. 30, 2013

(86) PCT No.: PCT/IB2013/059780
§ 371 (c)(1),
(2) Date: Apr. 28, 2015

(87) PCT Pub. No.: WO2014/068496
PCT Pub. Date: May 8, 2014

(65) Prior Publication Data
US 2015/0280039 A1 Oct. 1, 2015

(30) Foreign Application Priority Data

Oct. 30, 2012 (IT) .................. VI2012A0292

(51) Int. Cl.
| | | |
|---|---|---|
| *H01L 31/05* | (2014.01) | |
| *H01L 31/02* | (2006.01) | |
| *H01L 31/0203* | (2014.01) | |

(52) U.S. Cl.
CPC ...... *H01L 31/0516* (2013.01); *H01L 31/0201* (2013.01); *H01L 31/0203* (2013.01); *Y02B 10/12* (2013.01); *Y02E 10/50* (2013.01)

(58) Field of Classification Search
CPC ............ H01L 31/0516; H01L 31/0201; H01L 31/0203; H01L 31/049; Y02B 10/12; Y02E 10/50
See application file for complete search history.

(56) References Cited

U.S. PATENT DOCUMENTS 4,914,044 A * 4/1990 Grabmaier ............ H01L 31/046
136/244
5,558,723 A * 9/1996 Ufert .................. H01L 31/03921
136/244

(Continued)

FOREIGN PATENT DOCUMENTS

| WO | WO 2013/182954 | 12/2013 |
| WO | WO 2013/182955 | 12/2013 |
| WO | WO 2014/057367 | 4/2014 |

OTHER PUBLICATIONS

De Jong, "Single-step Laminated Full-size PV Modules Made with Back-contacted MC-SI Cells and Conductive Adhesives", Jun. 17, 2004, pp. 1-4.

(Continued)

*Primary Examiner* — Stanetta Isaac
(74) *Attorney, Agent, or Firm* — Fattibene and Fattibene LLC; Paul A. Fattibene

(57) ABSTRACT

The present invention provides a method for producing a back-contact back-sheet for a photovoltaic module comprising back-contact cells. The method comprising providing a substrate (210) having an outer surface (210*os*) facing the air-side of the photovoltaic module and an inner surface (210*is*) opposite the outer surface (210*os*) and facing the inside of the photovoltaic module. A layer of electrically conductive material (220) adapted to be formed as a connecting circuit (220*c*) to the electrodes of the solar cells is then applied to the substrate (210). The application of the layer of electrically conductive material (220) to the sub- (Continued)

strate (210) is performed in such a way that the layer of electrically conductive material (220) fixedly adheres to the inner surface (210is) of the substrate (210). The layer of electrically conductive material (220) is then processed so as to form the connecting circuit (220c). The step of processing the layer of electrically conductive material (220) comprises mechanically milling the layer of electrically conductive material (220), the processing being performed after the application of the layer of electrically conductive material (220) to the substrate (210).

23 Claims, 5 Drawing Sheets

(56) References Cited

U.S. PATENT DOCUMENTS

| | | | | |
|---|---|---|---|---|
| 2008/0128019 | A1* | 6/2008 | Lopatin | C25D 5/022 136/252 |
| 2009/0301543 | A1* | 12/2009 | Reddy | H01L 31/046 136/244 |
| 2011/0119973 | A1* | 5/2011 | Andre | G09F 9/30 40/541 |
| 2011/0290654 | A1* | 12/2011 | Weiner | C25D 5/022 205/170 |
| 2012/0000502 | A1* | 1/2012 | Wiedeman | H01L 31/048 136/244 |

OTHER PUBLICATIONS

Search report dated Sep. 17, 2013 in corresponding Italian Application No. VI2012000292.
Opinion dated Oct. 30, 2012 related to Search Report dated Sep. 17, 2013 in corresponding Italian Application No. VI2012000292.

* cited by examiner

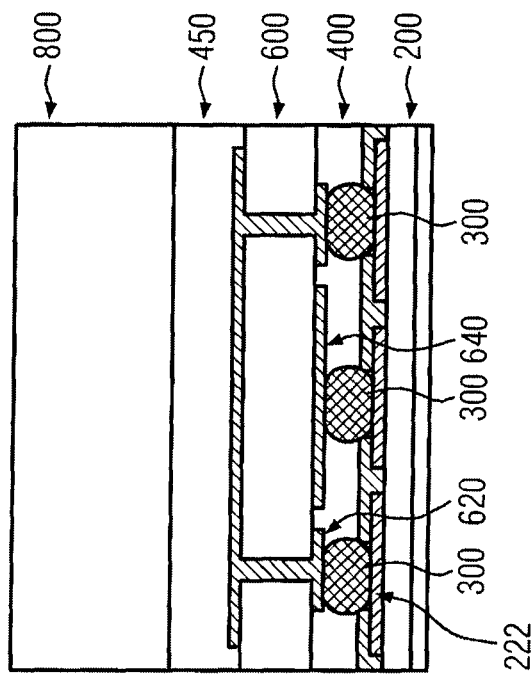
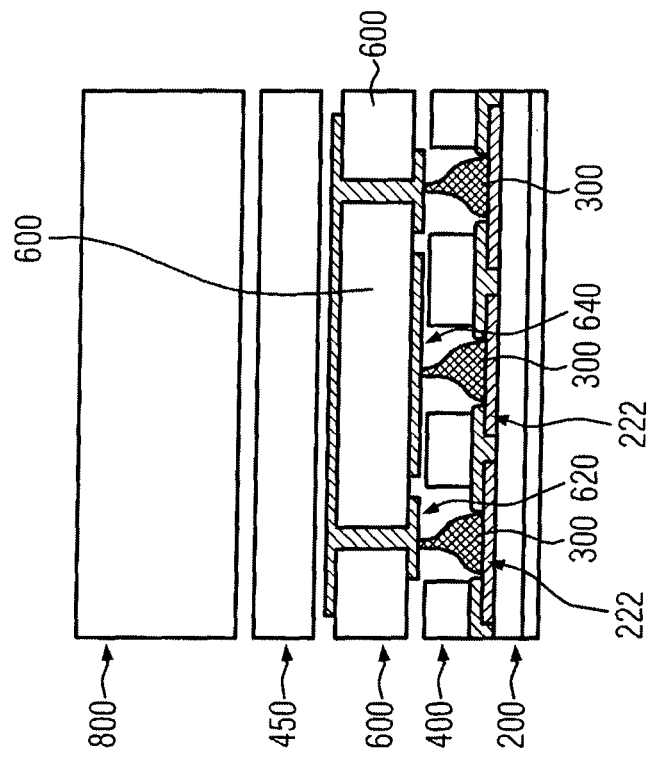
FIG. 2a
FIG. 2b

METHOD OF PRODUCTION OF BACK-CONTACT BACK-SHEET FOR PHOTOVOLTAIC MODULES

TECHNICAL FIELD OF THE INVENTION

The present invention concerns the field of photovoltaic modules. In particular, the present invention is related to new generation back-contact back-sheets for a photovoltaic module and methods for producing same. More in particular, the present invention is related to a method for producing a back-contact back-sheet in which a mechanical ablation is performed, for example by milling, with the aim of forming the connecting circuit on the inner surface of the back-contact back-sheet. Moreover, the present invention relates to a method of production of a back-contact back-sheet in which the ablation technique has the aim of opening a plurality of windows through the insulating substrate of the back-contact back-sheet so as to connect the connecting circuit to the outer surface of the photovoltaic module. This ablation technique, employed for opening the windows in the insulating substrate of the back-contact back-sheet, may advantageously comprise a mechanical milling.

STATE OF THE ART

Solar cells are used to transform solar light into electricity using the photovoltaic effect. Solar cells represent, therefore, one of the most promising energy sources that can substitute fossil fuels. Solar cells are formed of semiconductor materials and are assembled to form the so-called photovoltaic modules, which in turn are grouped to form photovoltaic systems usually installed on home roofs or similar.

In order to form photovoltaic modules, groups of solar cells are usually encapsulated using an encapsulating material, like, for example, a blend of polyethylene (PE) with a variable quantity of vinyl acetate (VA), normally called EVA. The encapsulating material containing the solar cells is then inserted between a surface layer and a base or back-sheet, so as to complete the photovoltaic module. The surface layer, or main surface of the module, normally made of glass, covers the surface of the module facing the sun and allows the solar light to reach the cells. On the other hand, the back-sheet accomplishes many different tasks. It protects the encapsulating material and the solar cells from agents, preventing at the same time the oxidation of the electrical connections. In particular, the back-sheet prevents the damage of the encapsulating material, of the cells and of the electric connections due to humidity, oxygen, and other factors related to environmental conditions. The back-sheet also provides electrical insulation for the cells and the corresponding electrical circuits. Furthermore, the portion of back-sheet facing the sun must have high opacity for esthetic reasons and high reflectability for functional reasons.

The electrical connection in the photovoltaic modules comprising traditional solar cells takes place on both the front and back sides of the cell, causing shading problems. In particular, the front electrode, namely the electrode exposed to light radiation, is electrically contacted using a technique called "H-patterning", which generates shading problems on the surface facing the light radiation because of the presence of metallic traces that screen the incident light on the front surface of the cell. Therefore, traditional electrical contacts lead to a decreased efficiency of the cells of the solar modules.

Back-contact cells are a new, more efficient and economic generation of photovoltaic cells in which both contacts of the electrodes of the cell are transferred to the back surface of the cell, namely the side not facing the light radiation. A model of back contact cell particularly efficient and easy to realize, is the Metallization Wrap Through cell (MWT) in which the contact to the front electrode is transferred to the back side of the cell by means of a through-hole made in the semi-conductive substrate.

The back-contact cells pose new technological problems relating to the design and structures of the modules intended to house them. For example, the back-sheet must have a structure able to support the connecting circuit which is put in electric contact with the ohmic contacts on the back surface of the cell. These ohmic contacts are connected to both electrodes (base and emitter). One of the solutions adopted to solve this problem is the so-called back-contact back-sheet, an evolution of the traditional back-sheet in which the connecting circuit is formed directly on the surface of the back-sheet facing the cell.

FIG. 1 shows the structure of a photovoltaic module comprising back-contact solar cells. Back-contact solar cell 600 is placed between an upper layer of encapsulating material 450 and a lower layer of encapsulating material 400. The cell 600 and the layers 400 and 450 of encapsulating material are then enclosed between a surface layer 800, normally made of glass or of transparent antireflective material, and the back-sheet 200, which can be a back-contact back-sheet. FIG. 1 shows the tracks of conductive material forming the connecting circuit 200c to be connected to the electrodes of the solar cells. If the back-sheet 200 is a back-contact back-sheet then the connecting circuit 220c is formed directly on the surface of the underlying substrate and it is firmly fixed to it.

The connecting circuit 220c is employed to guarantee an electrical contact with both electrodes, i.e. the base and the emitter, of the solar cell 600. In particular, the tracks of conductive material are provided with pads 222, defining the spots of the connecting circuit to be placed in electric connection with a contact to one of the electrodes formed on the surface of the cell 600.

The assembly of a photovoltaic module, such as the one shown in FIG. 1, is usually performed according to the procedure described below in the following.

The lower layer of encapsulating material 400, which is pierced so that the openings on the lower encapsulating material 400 correspond to the areas in which the pads 222 for the contact with the electrodes are positioned, is placed on top of the inner surface of the back-sheet or the back-contact back-sheet 200, namely the surface of the back-sheet or the back-contact back-sheet 200 facing the inside of the photovoltaic module. During the application of the lower layer of encapsulating material 400, the layer of encapsulating material is aligned to the back-sheet or back-contact back-sheet, so that the openings in the lower encapsulating material 400 correspond to or are aligned with the pads 222.

A lump or a drop of electrically conductive material, for example a conductive paste known as "Electrically Conductive Adhesive" (ECA), is placed on the pads 222 of the conductive tracks of the connecting circuit 220c.

Subsequently, the cells 600, that have to be incorporated in the module, are placed on the lower layer of the encapsulating material 400 so that each element in contact with the electrodes formed on the rear surface of the cell is in contact with a drop of conductive paste applied to one of the pads 222 and facing the cells 600 through one of the through-holes on the lower layer of the encapsulating material 400. The upper layer of the encapsulating material 450 is then placed on the upper surface of the cell 600, opposite to the rear surface that is in contact with the conductive paste placed on the pads 222. Finally, a layer of transparent and antireflective material 800 is placed on top of the upper layer of encapsulating material 450.

Once the structure is ready, as described above, it is turned up side down and laminated in vacuum at a temperature between 145° C. and 165° C. for a time varying between 8 and 18 minutes.

FIG. 2a shows the structure of the module before the lamination process. The module components, stacked as described above, can be seen individually. In particular, FIG. 2a shows a stack comprising, from the bottom to the top of the figure, the back-sheet or the back-contact back-sheet 200 with the conductive pads 222 on which a conductive paste 300 is placed, the lower layer of encapsulating material 400, the cells 600, the upper layer of encapsulating material 450 and the external layer 800. The electrical connection to the electrodes (base and emitter) of the cell 600 is guaranteed by the contact points 620 and 640 placed on the rear surface of the cell 600, i.e. on the surface facing the connecting circuit 220c and the back-sheet 200. The contact points 620 and 640 can be connected, to the positive electrode and to the negative electrode of the photovoltaic cell, respectively.

FIG. 2b schematically shows the structure of the module after the lamination process. In the first phase of the lamination, the structure is placed in a vacuum chamber in which the air is removed using pumps. The structure is, accordingly, subjected to a pressure which is adapted to compact the layers of the module, and to hold, at the same time, the vacuum in the area in which the module is placed. An entire cycle preferably lasts a total of less than 18 minutes. Preferably the cycle takes place at a temperature between 140° C. and 165° C.

The lamination causes the hardening of the conductive paste 300 because of its polymerization, thus causing the cells 600 to be fixed to the back-sheet or back-contact back-sheet 200. Moreover, the lamination process also aims to melt and then polymerize the upper and lower layers 450 and 400 of the encapsulating material.

Once the photovoltaic module has been assembled using the process described above, busbars are applied between the assembled module and the other modules of the photovoltaic system. For this purpose, through-holes or "windows" are made on the surface of the insulating substrate of the back-sheet or of the back-contact back-sheet facing the air side. Said through-holes cross the entire thickness of the insulating substrate of the back-sheet or of the back-contact back-sheet, so that they reach the lower surface of the connecting circuit facing the insulating substrate of the back-sheet on which the connecting circuit is applied. The through-holes or windows leave the lower surface of the connecting circuit exposed so that it faces the air side of the photovoltaic module and they have to be conveniently placed so as to allow accessing the connecting circuit in predetermined positions. Generally, there are four open windows: one for the input, one for the output and two for allowing the connection to the respective one or more bypass diodes.

Subsequently, a corresponding interconnection element or terminal (busbar) is introduced in each of the windows.

A portion of each busbar is then welded to the surface of the connecting circuit facing the through-hole made on the substrate of the back-sheet or back-contact back-sheet.

It should be noted that the back-sheet or back-contact back-sheet 200 is the base of the stack of components shown in FIGS. 1, 2 and 2b. In order to efficiently stack and assemble through lamination the components of the photovoltaic module, it is necessary that the back-sheet or the back-contact back-sheet 200 be as flat as possible. Possible bending of the back-sheet or of the back-contact back-sheet would compromise the stability of the stack of elements above it (lower layer of encapsulating material 400, cells 600, upper layer of encapsulating material 450, protective superficial layer 800). Moreover, if the back-sheet or the back-contact back-sheet 200 were bent, tensions along the surface and inside the solar cells 600 or inside the upper protective layer 800, that are, typically not flexible, could appear.

Normally, the back-contact back-sheet is produced by forming the insulating substrate 200 and applying on its inner surface the connecting circuit 220c. Firstly, a continuous layer of electrically conductive material without any pattern is fixed to the inner surface of the substrate 200, and then a connecting circuit 220c is formed on it.

The production of the continuous layer of electrically conductive material typically comprises a formation process based on photolithography followed by a chemical etching. The chemical etching of the portion of the conductive layer to be eliminated is typically made at temperatures between 40° C. and 60° C. and, in any case, at higher temperatures than room temperature. The etching temperature should be as high as possible in order to increase the production rate.

However, due to thermal expansion, and in particular due to the different expansion coefficients of the different layers, the high temperatures used during the chemical etching normally produce deformations of the back-contact back-sheet. This renders the back-contact back-sheet less flat. Consequently, the quality and the reliability of the back-contact back-sheet produced according to the traditional method are compromised.

Due to the above cited problems and to the drawback previously described, it is an object of the present invention to provide a method for the realization of a back-contact back-sheet in which the connecting circuit is formed using a precise, efficient and fast method to avoid the problems mentioned above and related to the known techniques.

BRIEF DESCRIPTION OF THE INVENTION

According to the present invention, a method of producing a back-contact back-sheet for a photovoltaic module is provided. This method is based on the new and inventive idea that the connecting circuit, connected to the electrodes of the solar cells, can be formed using a low temperature technique. In particular, in order to form the connecting circuit the present invention suggests using a mechanical ablation or milling technique on a layer of electrically conductive material, which, when firmly fixed to the inner surface of the back-contact back-sheet, is continuous. This technique is recommendable because the amount of material to be removed from the conductive layer is less than the quantity of residual material in the conductive layer once the connecting circuit has been formed. Moreover, the milling does not cause excessive heating of the conductive material layer.

On the basis of these considerations we suggest the method of producing a back-contact back-sheet for photovoltaic modules according to a preferred embodiment.

Preferred embodiments of the present invention are listed in the dependent claims and in the following description.

According to one embodiment of the present invention, a plurality of windows can be formed on the substrate of the back-contact back-sheet using a mechanical ablation or milling, so as to expose the connecting circuit to the outside.

This is advantageous because the same milling machine or, more generally speaking, the same milling device, can be used both for the processing of the conductive layer to form the conductive circuit and of the windows. In this way, it is possible to define relative position references in the milling device or in the layer to be processed so as to open the windows in the substrate of the back-contact back-sheet in the desired positions.

According to an embodiment of the present invention, the windows in the substrate are opened prior to the assembly of the back-contact back-sheet in the photovoltaic module. For this reason, the opening process is more simple than if it was performed after the photovoltaic module is finished and assembled.

According to an embodiment of the present invention, the openings or windows are made in the substrate prior to the milling of the electric conductive material which is performed in order to form the connecting circuit. According to an alternative embodiment, the opening of the windows is performed in the substrate after the milling of the layer of electric conductive material.

According to an embodiment of the present invention, the interconnection busbar to the other photovoltaic modules can be applied to the connecting circuit after the opening of the windows in the substrate of the back-contact back-sheet and before the back-contact back-sheet has been assembled in the photovoltaic module. This is advantageous because a hot soldering technique can be used to fix the busbar to the connecting circuit.

BRIEF DESCRIPTION OF THE FIGURES

Further features and advantages of the present invention will appear clearer from the following description of the embodiments of the device and method according to the present invention shown in the figures. In the figures, identical and/or similar and/or corresponding parts are identified by the same reference numbers or letters. In particular, in the figures:

FIG. 2a shows the structure of a photovoltaic module of the type shown in FIG. 1 before the lamination process;

FIG. 2b shows the structure of a photovoltaic module of the type shown in FIG. 1 after the lamination process;

DETAILED DESCRIPTION

In the following, the present invention will be described with reference to particular embodiments as shown in the attached figures. However, the present invention is not restricted to the particular embodiments described in the following detailed description and shown in the figures. Rather, the described embodiments simply show several aspects of the present invention whose scope is defined by the claims.

Further modifications and variations of the present invention will be clear for the person skilled in the art. As a consequence, the present description is to be considered as comprising all modifications and/or variations of the present invention, whose scope is defined by the claims.

In the following, the expressions "above" or "below" always refer to an imaginary ground plane. The expression "point A above (below) point B" indicates that the distance of point A to the ground plane is longer (shorter) than the distance of point B from the ground plane. Similarly, we will refer to "horizontal" ("vertical") direction in the case in which we refer to a direction parallel (perpendicular) to the ground plane.

As previously mentioned, the production of a back-contact back-sheet comprises the production of an insulating substrate, the application of the electrically conductive layer to the inner face of the insulating substrate and the processing of the same layer of conductive material so as to form a connecting circuit.

Figure 3:
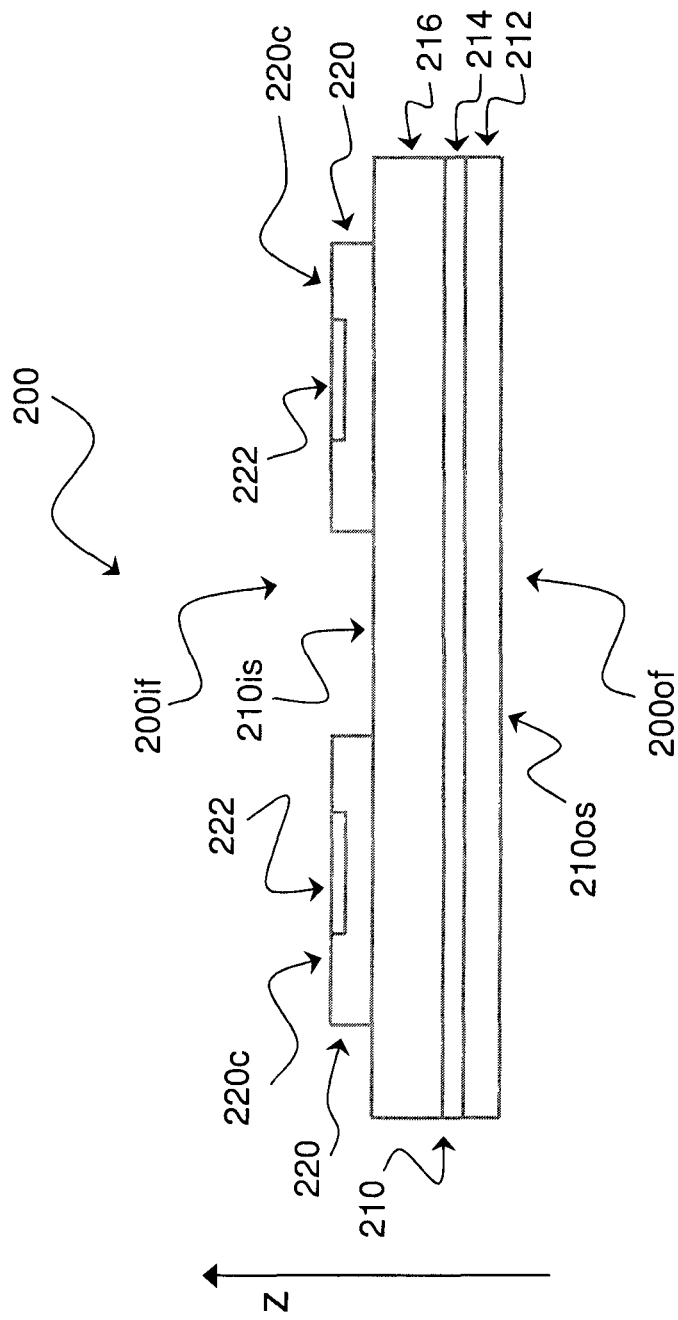
FIG. 3 shows a transversal section of a back-contact back-sheet made according to the method according to an embodiment of the present invention.

An example of a back-contact back-sheet is shown in FIG. 3. Normally, back-contact back-sheets produced using the method according to the present invention have been described, for example, in the previous Italian Patent Applications having application numbers VI2012A000132 and VI2012A000264.

The air-side surface of the photovoltaic module is the one placed below the back-contact back-sheet 200 shown in FIG. 3.

The back-contact back-sheet 200 comprises an outer face 200of facing the air-side of the photovoltaic module and an inner surface 200if opposite the outer surface and facing the inside of the photovoltaic module.

Moreover, the back-contact back-sheet 200 comprises an insulating substrate 210 facing the air-side of the photovoltaic module and a layer of electrically conductive material 220.

The method according to the present invention includes, as an initial step, the realization of the insulating substrate 210.

The insulating substrate 210 has an outer surface 210os facing the air-side of the photovoltaic module and substantially coincident with the outer face 200of of the back-contact back-sheet.

Moreover, the insulating substrate 210 has an inner surface 210is opposite the outer surface 210os and facing the inner side of the photovoltaic module.

In the embodiment of the back-contact back-sheet shown in FIG. 3, the insulating substrate 210 comprises a first insulating layer 212, an intermediate layer 214 and a second insulating layer 216.

According to the method according to the present invention, a first insulating layer 212 is made, which comprises a surface facing the air-side of the photovoltaic module substantially coincident with the outer surface 210os of the substrate 210. The first insulating layer 212 is used as a barrier against humidity, UV rays, oxygen and external agents which might enter the module and damage some of its components or deteriorate the polyurethane or polyester adhesive changing its color to yellow. The first insulating layer 212 can comprise a polymer such as, for example, polyvinyl chloride (PVF), polyvinyldenfluoride (PVDF) polyethylene tereflalate (PET) or other polymers. The first insulating layer 212 can also comprise other materials known from the state of the art. The first insulating layer 212 can have a thickness of approximately 25 µm to 75 µm or more.

An intermediate layer 214 can be applied on the inner surface of the first insulating layer 212 opposite to the surface facing the air-side. This layer is used as a barrier against humidity and water vapor. The intermediate layer 214 is typically made of a material which is impermeable to water vapor, for example aluminum. Said intermediate layer 214 has a thickness preferably comprised between 8 μm and 25 μm. The intermediate layer 214 can be applied to the first insulating layer for example by means of an adhesive.

According to some embodiments, the intermediate layer 214 can also be omitted.

The second insulating layer 216, which operates as electric insulator and as a further barrier, is then applied on the inner surface of the intermediate layer 214, opposite to the surface facing the first insulating layer 212. The second insulating layer 216 typically comprises a polymer, for example, polyethylene tereftale (PET), polyethylene (PE), polyvinyl fluoride (PVF) polyvidene fluoride (PVDF) polyethylene naftalite (PEN), polyamide (PI) or similar. The second insulating layer 216 can have a thickness comprised between 125 μm and 350 μm or more.

Figure 5:
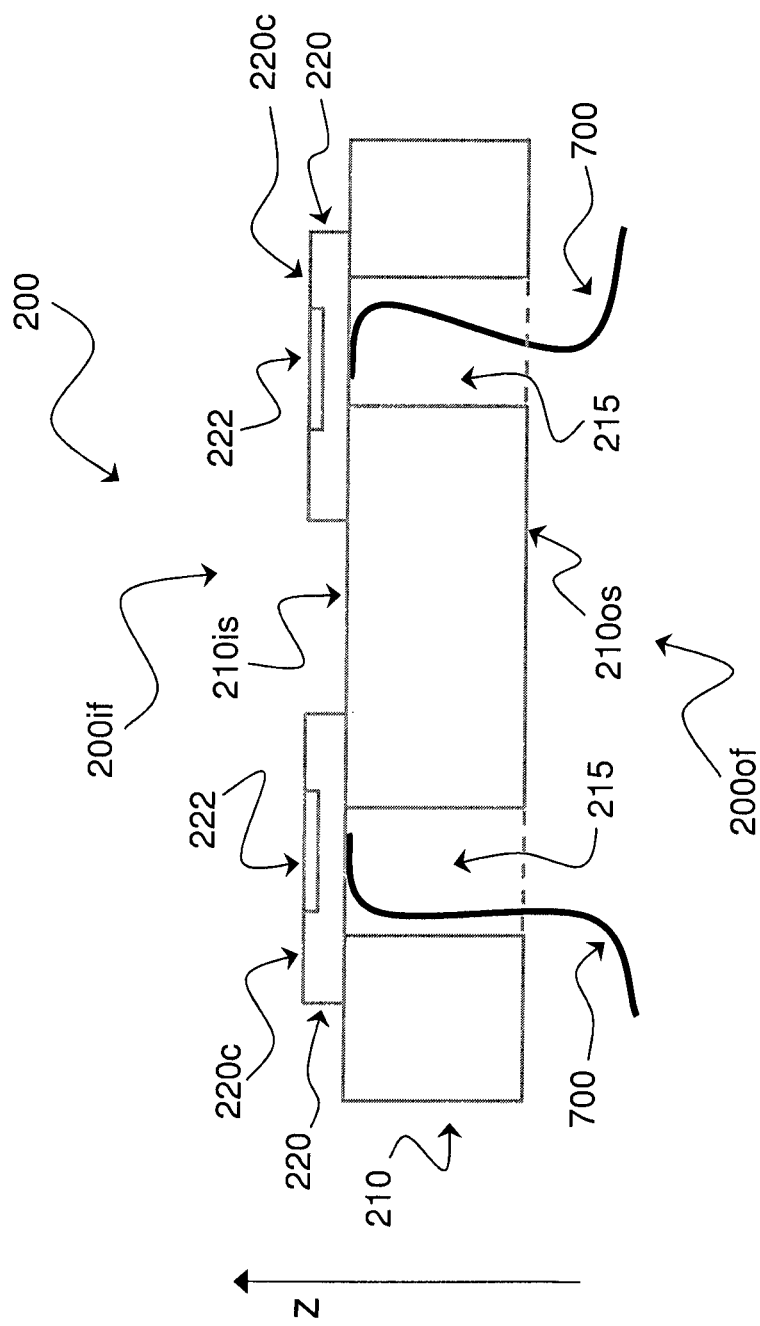
FIG. 5 shows a transversal section of a back-contact back-sheet made according to the method according to a further embodiment of the present invention, in which the substrate comprises a plurality of windows to connect the connecting circuit to the outside of the photovoltaic module.

According to alternative embodiments of the back-contact back-sheet not shown in the figures, the insulating substrate 210 comprises only a first insulating layer 212 and a second insulating layer 216 applied to the inner surface of the first insulating layer 212, without the intermediate layer 214. Moreover, as shown in FIG. 5, it is possible to realize a back-contact back-sheet in which the insulating substrate 210 is made of a single layer comprising for example one or more polymers, for example PET, PE, PVF, PVDF, PEN, PI, similar polymers or combinations of same.

Figure 4:
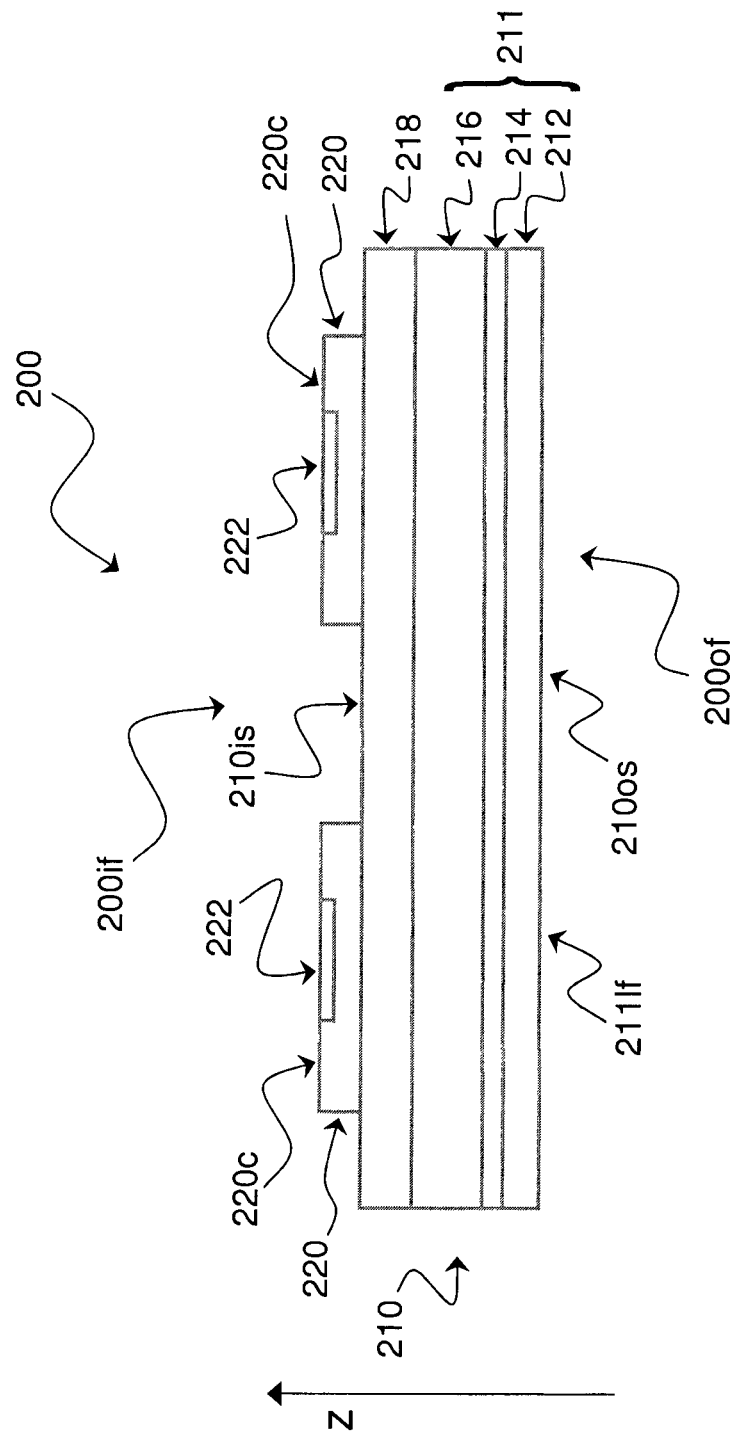
FIG. 4 shows a transversal section of a back-contact back-sheet made according to the method according to a further embodiment of the present invention.

According to a further embodiment of the method according to the present invention schematically shown in FIG. 4, the substrate 210 of the back-contact back-sheet 200 comprises an insulating portion 211 and a primer layer 218 applied to the insulating portion 211. The primer layer 218 and the insulating portion 211 of the substrate 210 were already described in the previous Italian Patent Application No. VI2012A000264. In the following only a brief description of these embodiments will be given. The insulating portion 211 of the substrate 210 comprises a lower surface 211*lf* facing the air-side of the photovoltaic module and substantially coincident with the outer surface 210*os* of the substrate 210 and, thus, with the outer surface 200*of* of the back-contact back-sheet. The insulating portion 211 also comprises an upper surface opposite to the lower surface 211*lf*. The insulating portion 211 can be made in any of the different ways in which the substrate 210 can be made according to the embodiments described above.

In particular, according to the embodiment shown in FIG. 4, the insulating portion comprises a first insulating layer 212, an intermediate layer 214 and a second insulating layer 216. The layers 212, 214 and 216, according to the embodiment shown in FIG. 4, have similar or identical characteristics and functionalities as the layers 212, 214 and 216, respectively, previously described with reference to the embodiment shown in FIG. 3. As already stated regarding the embodiment shown in FIG. 3, according to other embodiments, the insulating portion can comprise a first insulating layer 212 and a second insulating layer 216 directly applied to the first insulating layer, without the intermediate layer 214. Alternatively, the insulating portion 211 can comprise a single layer. The single layer or one or more of the multiple layers forming the insulating portion 211, can comprise one or more polymers like, for example, PET, PE, PVF, PVDF, PEN, PI, similar polymers and a combination of same.

The primer layer 218 is applied to the upper surface of the insulating portion 211 opposite to the outer surface 211*lf*, so that the inner surface of the primer layer 218, opposite to the surface facing the insulating portion 211, substantially coincides with the inner surface 210*is* of the substrate 210. When the back-contact back-sheet is finished, the primer layer 218 is placed between the lower insulating portion of the substrate 210 and the layer of conductive material 220, in which the connecting circuit 220*c* will be formed.

The primer layer 218 can be deposited using extrusion coating on the upper surface of the lower insulating portion or can be fixed using an adhesive system. The primer layer 218 has a thickness comprised between 50 μm and 350 μm and, preferably, between 50 μm and 150 μm.

Figure 1:
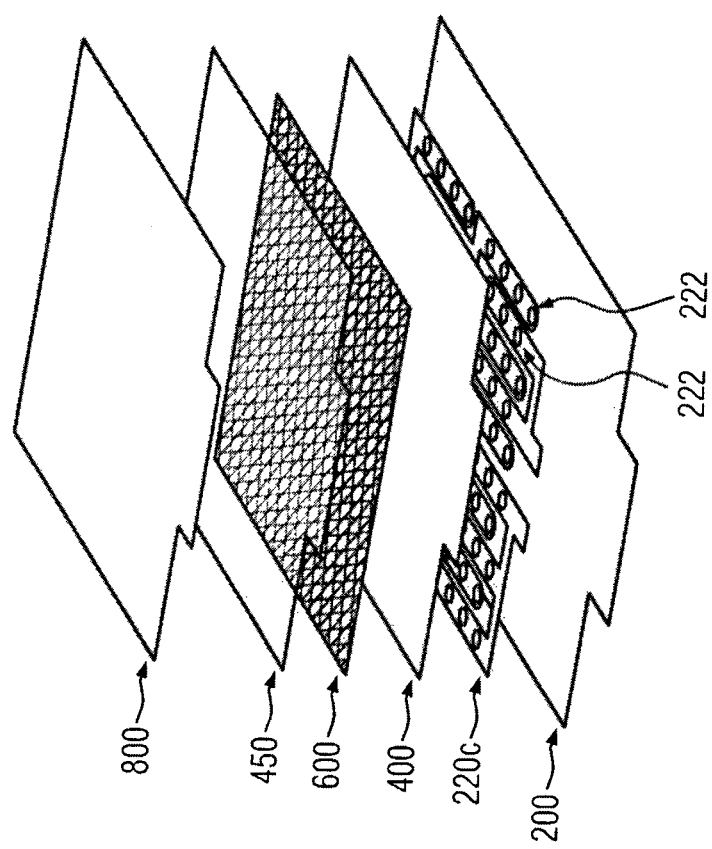
FIG. 1 shows an exploded view of a portion of a photovoltaic module comprising back-contact cells.

The main task of the primer layer 218 is to guarantee an improved adhesion of the inner surface 200*if* of the back-contact back-sheet to the layers of encapsulating material 400 and 450 shown in FIG. 1, and/or to a layer of thermo-adhesive material that have to be applied. This adhesion is obtained thanks to the lamination process of the photovoltaic module already described with reference to FIGS. 1, 2*a* and 2*b*.

The lamination temperature causes the fusion of the encapsulating or thermo-adhesive materials of the encapsulating material 400 or of the lower layer of the multi-layer structure, placed in contact with the inner face 200*if* of the back-contact back-sheet. According to the embodiment shown in FIG. 4, the inner face 200*if* of the back-contact back-sheet according to the present invention, comprises not only the metallic surface of the electrically conductive layer 220, but also the surface of the primer layer 218 facing the connecting circuit 220*c*. Accordingly, during lamination, the layer of encapsulating or thermo-adhesive material, partially melted, contacts the primer layer 218. The material or the blend of materials forming the primer layer 218 partially melts or softens during the lamination process. The primer layer 218 comprises one or more materials which are compatible and chemically alike to the encapsulating or thermo-plastic material forming the layer placed on top of the back-contact back-sheet. Accordingly, when the system is cooled after the lamination, the encapsulating layer 400 or the multi-layered structure will firmly adhere not only to the surface of the connecting circuit 220*c*, but also to the primer layer not covered by the connecting circuit 220*c*.

The lamination provides, therefore, a perfect adhesion between the primer layer 218 and the upper encapsulating or thermo-adhesive layer, so that all the conductive elements are perfectly included in and affixed to the internal surface 200*if* of the back-contact back-sheet.

The primer layer 218 comprises materials which are chemically alike and in any case, functionally alike to the material of which the encapsulating layers 400 and 450 are made. The primer layer 218 can comprise EVA (for example EVA with a content of vinyl acetate varying between 3% and 5%), linear low-density polyethylene (LLDPE), linear high-density polyethylene (LHDPE), polyolefin or a combination of same. Alternatively, the primer layer can comprise one or more thermo-adhesive materials. For example, the primer layer can comprise at least one of the following thermo-adhesive materials: acrylic copolymers, or polyurethane with additives, acrylic terpolymers grafted with maleic anhydride.

Once the substrate has been made, an electrically conductive material 220 is applied on its inner surface 210*is* opposite to the outer surface 210*os* facing the air-side, so that the layer 220 is firmly fixed to the inner surface 200*is* of the insulating substrate 210.

The layer of conductive material can be fixed on the inner surface 210is of the substrate 210 using adhesives. If the inner surface 210is of the substrate 210 comprises a thermo-adhesive material, such as shown, for example, in the embodiments described referring to FIG. 4, then the layer of electrically conductive material 220 can be applied to the inner surface 210is and can be easily fixed to it by heating the system so as to activate the adhesive function of the thermo-adhesive material. For example, the system can be heated to a temperature between 80° C. and 140° C. so as to fix the layer 220 to the inner surface 201 is of the substrate 210 comprising a thermo-adhesive material.

The conductive layer 220 can have a thickness approximately comprised between 25 μm and 70 μm. The layer of conductive material 220 comprises a high electrically conductive metal such as, for example, copper or aluminum.

When the layer of conductive material 220 is applied to the inner surface 210is of the substrate 210, it has normally the shape of a full and continuous sheet and its side surface has no trenches, indentations or meanderings. The layer of conductive material 220 is then processed so as to form a precise pattern comprising, for example, elongated elements such as tracks, paths, etc. This pattern forms the connecting circuit 220c to the electrodes of the solar cell.

According to an embodiment of the present invention, when the layer of electrically conductive material 220 is applied to the substrate 210, preferably as a homogenous and continuous sheet, without indentations or meanderings on its side surface, the sheet 220 and the substrate 210 have side dimensions which are a little bit larger than the dimensions of the final product.

Typically the final side dimensions of the product are 1050 mm (width)×1650 mm (length).

According to an embodiment, the side dimensions of the substrate 210 and of the sheet of conductive material 220 before the processing of the metallic sheet 220 are of 1100 mm×1700 mm. According to this embodiment, the application of the conductive sheet 220 on the substrate 210 is performed preferably using a roll-to-roll process. Accordingly, one of the dimensions (width) of the system formed by the substrate 210 and the conductive layer 220 applied on the substrate 210, corresponds to the width of the rolls used in the process.

Usually, the connecting circuit 220c is formed in the sheet of conductive material 220 using a technique normally used for the production of printed circuits. For example, the connecting circuit is formed in the conductive layer 220 using a lithographic optical technique in which a layer of photoresist is evenly applied to the surface of the conductive layer 220, exposed according to the pattern to be formed and finally developed. The surface comprising the developed photoresist is then treated with a chemical etching that forms the wanted pattern. At the end, the residual photoresist is removed. Alternatively, the connecting circuit can be formed on the layer of conductive material by means of a thermal ablation process using a laser.

Nevertheless, as previously described, both the chemical etching that follows the photolithography and the laser ablation are working techniques applied to the layer of conductive material 220 that, in order to be effective, must be applied at temperatures substantially higher than the room temperature. Since the layer of electrically conductive material 220 and the substrate 210 have different coefficients of thermal expansion, the heating of the system will produce a different expansion of the substrate 210 and the of layer of electrically conductive material 220. This causes tensions in the system so as to bend the substrate 210 and/or the layer of conductive material 220. The substrate 210 and/or the electrically conductive material 220 of the back-contact back-sheet are deformed by the heating, resulting in a loss of flatness of the device forming the finished back-contact back-sheet. This effect is highly undesirable, because, as already explained above, it is important that the back-contact back-sheet has a configuration as flat as possible so as to render the assembly operation of the photovoltaic module possible and easy.

Moreover, the devices used to perform the ultraviolet lithography are normally thought and realized to produce electronic devices, not photovoltaic modules. Accordingly, the dimensions of these devices are generally unsuitable for the treatment of layers having the typical dimensions of a photovoltaic module (about 1.1 m×1.7 m).

Another solution commonly adopted in state of the art consists in the application of an electrically conductive material, in which the electrical circuit has previously been formed, to the insulating substrate. The in the form of a circuit pre-printed layer is then fixed to the inner surface of the insulating substrate of the back-contact back-sheet. This solution, however, is not convenient because it requires a very precise alignment of the pre-printed electrically conductive material layer to the substrate. Moreover, the use of pre-printed layers allows only the periodic repetition of a fixed pattern and does not allow, for example, the realization of non symmetric circuits or of circuits for which it is not possible to identify a main pattern periodically repeated on the plane.

According to another possible method of formation of the connecting circuit, a discrete sequence of conductive elements is applied in predetermined positions on the inner surface of the substrate of the back-contact back-sheet so as to form the pattern of the connecting circuit. However, this solution is not very practical because it requires each conductive element to be placed very precisely on the inner surface of the substrate.

In order to avoid these problems, the present invention suggests a processing technique of the layer of conductive material 220 already fixed to the substrate 210 that is performed at room temperature, without the need or the excessive production of heat.

According to the production method according to the present invention, once the layer of conductive material 220 has been fixed to the inner surface 210is of the substrate 210, it is processed so as to obtain the connecting circuit 220c by means of mechanical ablation.

According to an embodiment of the present invention, the mechanical ablation is performed by means of a milling machine.

The milling machine is equipped with one or more milling cutters which are free to move on the plane identified as the xy plane. The xy plane can, for example, be a horizontal plane parallel to the plane of the ground. Alternatively, the xy plane can be vertical and perpendicular to the plane of the ground. The xy plane can also be inclined so as to form a predefined angle with the plane of the ground. According to an embodiment of the present invention, each milling cutter has a travel length equal to 1200 mm along the x axis and 2100 mm along the y axis. According to an embodiment, the precision with which every milling cutter can be positioned along each of the two axis x and y, is 0.05 mm.

The milling machine is provided with a mechanism for positioning the milling cutters along the z axis perpendicular to the xy plane. If the xy plane is horizontal, then the z plane is along the vertical direction.

According to an embodiment, the milling machine is equipped with a CAD/CAM system for the precise positioning of the milling cutters in each point of the xy axis. The CAD/CAM system can process any kind of pattern.

Preferably, the milling machine is a portal milling machine. One or more high-speed milling cutters can be mounted on the milling machine.

According to the present invention, the complex comprising the substrate 210 and the layer 220 fixed to the inner face 210*is* of the substrate 210, is placed on a supporting plane placed under the milling machine or under the milling cutters of the milling machine. This plane defines the xy plane along which the milling cutters are free to move.

The support, on which the device is placed, can comprise a vacuum table. In this case, the support plane corresponds to the plane of the vacuum table. The use of a vacuum table allows holding the complex comprising the substrate 210 and the layer of conductive material 220 fixed in place during the processing of the layer of electrically conductive material 220. The complex is, in fact, placed on the plane of the table, under which there is a vacuum chamber from which air is pumped out. The complex is held in its position thanks to the pressure difference between the air column above the complex and the vacuum underneath and by the friction force between the plane of the vacuum table and the surface of the complex in contact with the plane.

Preferably, the complex comprising the substrate 210 and the layer 220 fixed to the inner face 210*is* of the substrate 210 is placed on the support plane so that the inner surface 210*is* and the outer surface 210*os* of the substrate 210 are parallel to the supporting plane. In this way, the z axis is perpendicular to the inner surface 210*is* and to the outer surface 210*os* of the substrate 210, as shown in Figures from 3 to 5.

More particularly, the complex is positioned on the supporting plane so that the outer surface 210*os* of the substrate 210 face the supporting plane and is parallel to the same plane. Accordingly, when the complex is placed on the supporting plane, the surface facing the outer surface of the layer of conductive material 220, is oriented so as to face the only milling cutter or the multiple milling cutters of the milling machine. In particular, the outer surface 210*os* can be in contact with the supporting plane or with a protective or covering layer directly placed on the supporting plane.

The milling cutters are then moved along the z axis so as to get closer to the conductive layer 220. The cutters are then shifted along the z axis until they reach a level which allows cutting the layer of conductive material 220 without damaging the inner surface 210*is* of the substrate 210. The level of the plane, on which the surface exposed by the layer of conductive material 220 is placed, is considered to be the reference level along the z axis in order to determine the right height of the milling cutters along the z axis.

The positioning along the z axis of each milling cutter is done taking as a reference the upper surface of the conductive element. The position of the milling cutters along the z axis can be kept by means of a skid or by continuously detecting the height of the surfaces, by means of a laser sensor. If the thicknesses of the materials are precise enough, the position of the milling cutters along the z axis can be kept using the surface of the working plane as reference level.

The layer of conductive material 220 is then processed using the milling cutters so as to form the pattern of the connecting circuit 220*c*, in the layer 220. Portions of the layer of the conductive material 220 are then removed so as to form the trenches, the indentations and the meanderings defined by the side surface of the connecting circuit 220*c*.

According to an embodiment of the present invention, a CAD/CAM system may operate the movement of the milling cutters along the xy plane so as to ablate the right portions of the connecting circuit 220 so as to form the connecting circuit 220*c*.

According to an embodiment, dedicated aspirators surrounding the milling cutters remove the shavings formed during the processing.

The milling cutters working on the layer of conductive material 220, which is fixed to the surface 220*is* of the substrate 210 should carve the electrically conductive material of the layer 220 without damaging the underlying layer, namely the inner surface 210*is* of the substrate, which can comprise for example, a polymeric, encapsulating or thermoadhesive material.

It has to be noted that for the embodiment shown in FIG. 4, in which there is a primer layer 218 in the substrate 210, the positioning along the z axis of the cutters is less critical than in the case in which the primer layer 218 is not present. Since the positioning of the milling cutters along the z axis is accurate to approximately 1 µm, the portion of the inner surface 210*is* of the substrate 210 accidentally removed from the milling cutters can have a thickness in the order of approximately 1 µm. However, the primer layer 218 has a thickness which is definitely higher than 1 µm and, in any case, not less than 50 µm. Accordingly, the accidental removal of a thin layer of primer 218, with a thickness of removed material which is not higher than a few micrometers, will not have particularly negative effects on the subsequent phases of the assembly process of the photovoltaic module. In particular, since the milling of the electrically conductive material 220 is performed prior to the assembly of the back-contact back-sheet in the photovoltaic module, the lamination process will be performed after the milling of the electrically conductive layer 220. During lamination, the primer layer 218 partially melts or softens, erasing in this way possible deep incisions erroneously made during the milling of the inner surface of the primer layer 218.

According to an embodiment of the present invention, each milling cutter operating on the electrically conductive material 220 makes carves across the thickness of the layer 220 at a rate equal to or higher than 20 m/min. According to this embodiment, the rotation speed of each milling cutter is higher than 40000 rotations/min, so as to allow the desired carving speed.

According to an embodiment, each milling cutter has the same width as the trench to be formed in the conductive material layer 220. A cutter with the right diameter can be chosen according to the width of the trench to be formed in the conductive layer 220. Moreover, different milling cutters mounted to the milling machine can have different diameters, allowing in this way the optimization of the width of the ablated channel and the ablation of the side mass.

The milling cutters used for processing the layer of conductive material 220 can be either horizontal or vertical, depending on the needs. The choice is made according to the chosen cutting speed according to known methods.

According to an embodiment of the method according to the present invention, the milling cutters operating on the conductive layer 220 work simultaneously and join up on the xy plane. This operating way allows increasing the processing speed of the complete sheet since there are several units operating in parallel and joining up together. Moreover, this allows reaching the industrial aim of obtaining a complete sheet comprising the circuit in 60 to 180 seconds.

Once the desired portions of the layer of conductive material 220 have been ablated so as to form the connecting circuit 220*c*, the milling machine is used to remove a portion of the edge of the complex made by the substrate and the processed conductive layer so as to render the side dimensions of the system equal to the dimensions of the final product. For example, if the complex of insulating substrate 210 and the conductive layer 220 have side dimensions of 1100 mm×1700 mm and the completed back-contact back-sheet must have dimensions of 1050 mm×1650, then a stripe of the projection of each of the four sides of the complex along the xy plane can be removed, each stripe having a width equal to 25 mm.

In the following, the removed portion of the edge or the removed side portion of the complex will be called "frame". It is advisable to remove the edges of the complex made by the substrate 210 and the conductive layer 220 after the conductive layer 220 has been processed using milling. In fact, this procedure separates two portions of the sheet (the central part to be kept and the frame to be eliminated) and it could be thus more difficult to fix the sheet on the supporting plane, for example on the plane of a vacuum table.

The removal of the edges of the complex closes the process according to an embodiment of the present invention and the back-contact back-sheet can be considered to be in its final form.

A method has been accordingly proposed in which the connecting circuit 220*c* is formed on the conductive layer 220 fixed to the substrate 210 using a cold technique such as milling. The substrate 210 is therefore not excessively heated during the formation of the conductive layer 220, avoiding, in this way, unwanted deformations and/or loss of flatness of the substrate 210. Moreover, the milling made with a dedicated machine allows very precise control of the positioning and of the movements of the milling cutters, allowing in this way an equally precise control of the form and the quality of the ablated portion of the conductive material 220.

According to a further embodiment, the production method of the back-contact back-sheet according to the present invention comprises a further step. According to this embodiment shown in FIG. 5, after the insulating substrate 210 has been produced and after the electrically conductive material 220 has been fixed to the inner surface 220*is* of the substrate 210, an ablation technique is used to open a plurality of windows 215 going through the thickness of the insulating substrate 210 and thus exposing the surface of the electrically conductive layer 220, facing the inner surface 210*is* of the substrate 210, to the air-side of the back-contact back-sheet.

According to an embodiment, the opening of the windows 215 is performed after the formation of the connecting circuit 220 in the layer of conductive material 220. According to an alternative embodiment, the opening of the windows 215 is performed before the formation of the connecting circuit 220*c* in the layer of conductive material 220.

According to an embodiment, the opening of the windows 215 in the substrate 210 is performed before the assembly of the back-contact back-sheet in the photovoltaic module and, thus, before the lamination of the stack of elements 200, 300, 400, 600, 450, 800 shown in FIG. 2*a*.

Preferably, the windows 215 are opened so as to have their longitudinal axis perpendicular to the plane on which the inner surface 210*is* and the outer surface 210*os* of the substrate 210 lay. In other words, the windows 215 are opened so as to go through the thickness of the substrate 210 along a direction going from the outer surface 210*os* to the inner surface 210*is*. This direction is preferably orthogonal to the surfaces 210*os* and 210*is*. In the embodiments shown in FIGS. 3 to 5, the windows axis is along the z axis.

According to an embodiment of the present invention, the windows 215 are opened in the substrate 210 using a milling process performed using a device comprising a milling machine. According to an embodiment, the milling device used to open the windows 215 in the substrate 210 has characteristics which are similar or equal to the milling device used to form the circuit 220*c* in the layer of conductive material 220.

According to a particular embodiment, the same device is used for processing the layer of conductive material 220, for the purpose of forming the connecting circuit 220*c*, and for opening the windows 215 in the substrate 210 of the back-contact back-sheet 200.

According to one of the two previous embodiments and similarly to what already described referring to the processing of the conductive layer 220, the complex, comprising the substrate 210 and the layer 220 fixed to the inner face 210*is* of the substrate 210, is placed on a supporting plane placed under the milling cutter or the milling cutters of the milling machine. The supporting plane defines the xy plane along which the milling cutters can freely move.

The support on which the complex is placed can comprise a vacuum table. The complex is placed on the plane, preferably horizontal, of the support so that the outer surface 210*os* of the substrate 210 faces the milling cutter or the milling cutters of the milling machine. In this way, both the exposed surface of the layer of conductive material 220 and the portion of the inner surface 210*is* face the supporting plane. In other words, the complex to be milled is placed on the supporting plane so that the surface that corresponds to the inner surface 210*is* of the back-contact back-sheet when the back-contact back-sheet will be completed face the supporting plane. In this way, the outer surface 210*os* of the back-contact back-sheet faces the milling cutters.

If the same device is used to open the windows 215 and to process the conductive layer 220, the complex, comprising the substrate 210 and the conductive layer 220 and placed on the supporting plane, is turned upside down during the opening of the windows 215 with respect to the configuration taken during the processing of the conductive layer 220 by milling.

The milling cutter or the milling cutters of the milling machine are then moved along the z axis so as to get closer to the substrate 210. The height along the z axis of the plane, on which the outer surface 210 of the substrate lays is considered to be the reference level along the z axis in order to determine the right level of the milling cutters along the same axis.

The windows 215, preferably four, are then opened in the insulating substrate 210 using a milling process.

The right positioning of the milling cutters along the z axis is a critical operation during the opening of the windows in the substrate 210 because the substrate 210 has to be ablated by a length along the z axis exactly equal to its thickness. In this way, the substrate is ablated over a depth so that the layer of conductive material 220 is exposed to the outer part of the photovoltaic module, but without removing any portion of the layer of conductive material 220. If the milling cutters were positioned too near the layer of conductive material 220, the ablation would be too deep and portions of the layer of conductive material 220 would be probably damaged or eroded, since the thickness of the conductive layer 220 is typically between 25 $\mu$m and 70 $\mu$m.

On the other hand, if the milling cutters were too far away from the layer of conductive material 220, the insulating substrate 210 would not be entirely ablated in correspondence to the windows 215 and a residual insulating polymeric layer would remain on the surface of the conductive layer 220 facing the substrate 210, this would not allow the electrical contact with the layer of conductive material 220.

According to an embodiment of a present invention, in order to avoid this problem, and thus to place the milling cutter or the milling cutters in a position that guarantees the positioning with sufficient precision along the z axis, the milling machine is provided with a closed circuit control system wherein the electrical resistance between the milling cutter or the milling cutters and the layer of electrically conductive material 220 is measured. A milling cutter, on which the measurement of the electrical resistance is made, is then gradually inserted into the substrate 210 till the measurement of electrical resistance shows a condition of electric conductivity. At this point, the insertion of the milling cutter is stopped by stopping its movement along the z axis. The position reached by the milling cutter along the z axis is kept during the milling in order to perform the opening of the windows 215.

According to a further embodiment, the substrate 210 can be partially ablated in correspondence to the windows 215 and the polymeric remains can then be removed from the surface of the layer of conductive material. According to this embodiment, the substrate 210 is milled by a depth which is less than its thickness. In particular, the milling is stopped at a predetermined safety level along the z axis. The safety level is placed between the level along the z axis of the surface of the layer of conductive material 220 facing the substrate 210 and the level along the z axis of the outer surface 210os of the substrate 210. A residual portion of the substrate 210 is thus left on the surface of the conductive material layer 220 that should be exposed.

According to a particular embodiment, the residual portion of the substrate 210 which is not removed by the milling of the window 215 is removed by means of laser ablation.

According to a further particular embodiment, the residual portion of the substrate 210 not removed from the window 215 is cut into thin layers successively removed using air blows. These thin layers are produced by means of laser cutting, which realizes a series of parallel cuts, typically distant 1.5 mm to 2 mm from each other. The laser which incises the residual polymeric layer reduces the cohesion force of the adhesive layer thanks to local heating and is responsible for the lifting of the thin layers, which are, thus, easy to be removed, for example, by means of compressed air.

According to an alternative or complementary embodiment, the opening of the windows 215 in the substrate 210 can be obtained using laser ablation.

It is pointed out that the above-described technique, employed to open the windows 215 can be combined. For example, one or more windows may be opened using milling whereas other windows may be opened using laser ablation. Some of the windows formed using milling might have been opened by removing all the material with one or more milling cutters while other windows might have been formed partially by ablating the substrate 210 with a milling cutter and partially by removing the residual material of the substrate 210 using laser ablation or cut into thin layers. Generally, any combination of the previous techniques is possible.

Accordingly, the present invention also shows a practical and precise method for opening the windows 215 in the substrate 210 of a back-contact back-sheet 200.

The opening of the windows, normally four (an entry one, an exit one, one for the first bypass diode and one for the second bypass diode), is a critical step and it is preferable for it to be executed before the lamination of the module because, once the module has been laminated, the relative fragile cells are contained therein. The windows should be conveniently placed so as to allow access to the circuit in the wanted positions. Moreover, it is recommended that the opening of the windows is performed during the processing of the back-contact back-sheet instead of after the lamination of the module. This is preferable because, once the module has been assembled, the reference positions of the points, in which the windows have to be opened on the air-side 200of of the back-contact back-sheet, are lost.

The present invention shows a convenient and precise method for opening the windows during the production of a back-contact back-sheet performed before the assembly phase of the back-contact back-sheet in the photovoltaic module. The present invention suggests using a milling process which allows a very precise control of the position, in which the windows are opened on the surface 200of of the back-contact back-sheet, facing the air side. Moreover, the present invention also suggests the use of a similar milling machine, or of the same milling machine both for opening the windows in the substrate 210 of the back-contact back-sheet and for processing the layer of electrically conductive material 220 for the purpose of forming a connecting circuit 220c. In this way, relative position references can be made in the milling machine employed or in the complex to be processed, so as to open the windows 215 in predetermined points of the connecting circuit.

These references can be made by means of through-holes that are made in the outer frame of the complex comprising the substrate 210 and the layer of conductive material 220 fixed to the substrate 210. Accordingly, the references are outside the portion of circuit or the portion of the layer that will be included in the final product and are normally set up during the processing of the pattern forming the connecting circuit 220c. In this embodiment, it is clear that the removal of the frame from the complex, comprising the substrate 210 and the conductive layer 220, has to be executed after both the processing operations has been performed on the conductive layer, i.e. the formation of the connecting circuit 220c and the opening of the windows in the substrate 210.

The through-holes will therefore have the circuit connecting circuit 220c, which has a predetermined pattern, as reference. The through-holes used as reference on the layer can be engaged to suitable pins fixed to the milling machine. In this way, the reference system on the layer to be processed will be in correlation to a reference system inside the milling machine. This correlation between the reference systems on the layer and inside the milling machine is particularly helpful in the case in which the layer to be processed is turned upside down to switch from the position in which the processing of the layer of conductive material 220 is performed, for the purpose of forming the circuit 220c, to the position in which the operation of opening the windows 215 in the substrate 210 is performed.

According to an embodiment of the present invention, further shown in FIG. 5, after the windows 215 have been opened in the substrate 210, interconnecting terminals 700, or busbars, are applied, through the windows 215, to the portions of the connecting circuit 220c facing the outer side of the photovoltaic module.

Each busbar 700 is brought into contact with the exposed lower surface of the conductive layer 220, or of the connecting circuit, after it has been introduced inside a corresponding window 215 from the outer surface 200of of the back-contact back-sheet. Each busbar 700 is then fixed to the portion of conductive layer 220 contacted so as to guarantee an electric connection between the conductive layer 220 and the busbar 700.

The busbars 700 have a thickness comprised between 300 µm and 700 µm, with a typical thickness of about 700 µm.

The busbars 700 can have different shapes. For example, the busbars 700 can be threadlike or they can be comprised in ribbons with a width comprised between 4.0 mm and 10.0 mm.

According to an embodiment, the busbars 700 comprise copper and are electrically connected to the connecting circuit 220c or to the layer of conductive material 220, preferably comprising copper, by means of soldering or brazing. It is convenient to perform this connection on the back-contact back-sheet before it has been assembled into the photovoltaic module because the soldering or, in any case, the electric connection between the busbar and the connecting circuit 220c or to the layer of conductive material 220, can be advantageously performed at high temperature.

According to a further embodiment, the busbars 700 comprise aluminum and are fixed to the surface of the layer of conductive material 220 facing through the windows 215 prior to the assembly of the back-contact back-sheet in the photovoltaic module. According to a particular and preferred embodiment, both the layers of conductive material 200 and the busbars 700 comprise aluminium.

Normally, different components made in aluminum are soldered using brazing, an operation that has to be performed at high temperature (about 450° C.). In the case of connection of the busbars 700 made of aluminium to a layer of conductive material 220 or to the connecting circuit 220c, the brazing is not a recommended technique because, as already shown, the danger of bending the layer of the conductive material 220 or the substrate 210 is very high due to the high temperatures needed and to the different expansion coefficients of the two layers. The high temperatures reached during the brazing of the aluminium could also partially melt the substrate 210 in contact with the layer of conductive material 220.

An embodiment of the present invention suggests the use of a spot-welding technique for solving the problem of electrically connecting a busbar 700 comprising aluminium to the connecting circuit 220, which preferably comprises aluminium as well and is fixed to the inner surface 210is of the substrate 210.

The spot-welding of components made of aluminium is used in the automobile industry, wherein different components made of aluminium and having similar thicknesses, normally in the order of several millimeters, are welded. The welding of a busbar having a thickness of 700 µm on a conductive layer having a thickness between 25 µm and 70 µm is a very difficult task.

According to an embodiment of the present invention, the complex, comprising the layer of conductive material 220 and the substrate 210 in which the windows 215 have been opened, is placed on a supporting plane, in a similar manner as already described above with reference to the opening operation of the windows 215 in the substrate 210. The supporting plane must be electrically conductive. The complex lies on the electrically conductive supporting plane so that the exposed surface of the layer of conductive material 220 faces the plane and so that the outer surface 210is of the substrate 210 is exposed. The configuration of the complex on the supporting plane is similar or equal to the configuration taken by the complex on the supporting plane during the opening operation of the windows 215.

The supporting plane can, for example, be the plane of a vacuum table. In this case the supporting plane of the vacuum table must be electrically conductive. The vacuum table can be the same table on which the opening operation of the windows 215 has previously been performed.

The spot-welding technique requires the use of two electrodes. According to an embodiment of the present invention here-described, a first electrode (upper electrode), properly made, is applied to the busbar 700 to be welded. The second electrode (lower electrode), is the supporting plane which, as already pointed out, is electrically conductive and is electrically connected to the layer of conductive material 220. The upper electrode, preferably applied to the busbar 700 from above, is placed so as to apply a high enough pressure so as to hold the busbar pressed onto the exposed surface of the layer of conductive material 220. The upper electrode is structured so as to localize the pressure in a very small region, almost a point, of the portion of the busbar 700 to be welded and on which the electrode is applied. The supporting plane can contrast the pressure force applied from the upper electrode or from the first electrode on the busbar 700 and can therefore held the whole system in its initial position. These pressure forces, applied from the upper electrode, and the supporting plane, are preferably directed along the z axis shown in FIG. 5.

Afterwards, current is let flow between the upper electrode and the lower electrode, between which the aluminum parts to be connected are placed. The resistance to the flow of current exerted by the aluminum parts is responsible for the fusion of same in positions localized in the pressure points. The busbar is therefore welded to the layer of conductive material 220 in the points in which the pressure is applied and through which the current flows.

In order to facilitate the welding of the points, according to a particular embodiment, the busbar 700 is made so as to comprise little tips in correspondence to the portions to be welded. The tips are such that they facilitate the melting of the portion of the busbar 700 to be welded.

In this way, the high pressures which are required by spot-welding can be applied, since they are contrasted by the supporting plane. Moreover, the surface of the layer of the conductive material 220 remains flat and is always at room temperature everywhere, with the exception of the point portions where the welding takes place. In this way, it is possible to avoid bringing extended portions of the layer of conductive material 220 to very high temperatures during the welding of the busbar 700. The above-described configuration also has the advantage that the thinnest material of the layer of conductive material 220, placed below, is in contact with the conductive plane which, being made of metallic material, also provides a cooling of the thin layer 220 of conductive material.

According to a further embodiment, the busbar 700 is welded to the layer of conductive material using ultrasonic welding. According to this embodiment, the busbar 700 and the layer of conductive material 220 preferably comprise aluminum. A sonotrode is placed in contact with the busbar 700 that has been placed in contact with the surface of the layer of conductive material facing outwardly, through the windows 215. In other words, the portion of the busbar 700 to be welded to the layer of conductive material 220 is located between the exposed surface of the layer of conductive material 220 and the sonotrode.

The sonotrode vibrates with ultrasonic frequency producing heating due to its friction against the surface of the portion of the busbar 700 to be welded. The heat produced by the friction is responsible for the melting of the portion of the busbar on which the sonotrode is applied and is, therefore, responsible for its welding to the layer of conductive material 220.

This technique also allows the application of heat, even if only a limited quantity, to a very restricted area of the connecting circuit 220c or of the electrically conductive layer 220, avoiding, in this way, the heating of extended areas of the surface of the conductive material 220. If the heating would affect more extended areas of the conductive material 220, then it could lead to the bending of the conductive material 220 or of the substrate 210. A further advantage of the ultrasonic welding consists in that the vibration of the sonotrode destroys the layer of aluminum oxide naturally present on the surfaces of aluminum and, in this way, it exposes the layer of pure aluminum.

Alternatively, or in addition to the welding or to the brazing, the busbars 700 can be electrically connected to the connecting circuit 220c or to the layer of conductive material 220 using electrically conductive adhesive such as, for example, ECA (Electrically Conductive Adhesive) or highly conductive adhesive tapes.

According to this embodiment, both the busbars and the layer of conductive material 220 may comprise copper or aluminum. The layer of conductive material 220 does not need to comprise the same material of the busbar 700. For example, it is possible that the busbar 700 comprises aluminum and the conductive material 220 comprises copper or vice versa.

It has to be noted that welding techniques or other techniques used to connect the busbars 700 can be combined in the same back-contact back-sheet 200. For example, one or more busbars can be welded using spot-welding while other busbars can be welded using ultrasonic welding. Moreover, other busbars can be connected to the circuit 220c using an electrically conductive adhesive.

The embodiments of the present invention described above allow electrically connecting the busbar 700 to the layer of conductive material 220 or to the connecting circuit 220c before the back-contact back-sheet has been assembled in the photovoltaic module. This allows the manufacturer of photovoltaic modules to be more flexible during the welding of the busbar to the connecting circuit 220c. For example, the welding can be performed at high temperatures without danger of damaging other components of the module such as, for example, the cells, the encapsulating layers or the upper protection layer. Moreover, the welding may be a spot-welding or an ultrasonic welding, which are techniques that could not be used on the assembled module. If these steps were to be performed on the assembled module, damage could be caused to the cells and the localized heating would modify the behaviour of the encapsulated layers. Moreover, since the complex of the panel is made of different layers, it would not be possible to apply the pressures needed for the use of a sonotrode or of an electrode for spot-welding with the necessary counterpressure, without avoiding the risk of ruining the most fragile layers of the module. Moreover, if the photovoltaic module were assembled, it would not be possible to perform an easy spot welding because the second electrode would not be available, since the surface of the conductive layer facing inside the photovoltaic module would not be reachable.

After the busbars 700 have been electrically connected and fixed to the layer of conductive material 220 or to the connecting circuit 220c, a resin can be put in the windows 215 so as to protect the electrical connection between the busbar and the conductive layer 220 from external agents (potting).

According to further embodiments, after the connecting circuit 220c has been formed in the layer of conductive material 220, an organic protective layer (OSP, Organic Surface Protection) can be laid down on the surface of the circuit 220c facing outwardly. The deposit can be performed, for example, using coating, serigraphy, submersion, etc. The protective layer is described in more detail in the Italian Patent Application having the application number VI2012A000132.

According to further embodiments, after the connecting circuit 220c has been formed in the layer of conductive material 220, a layer of dielectric material (ILD, Interlayer Dielectric), can be laid down on the surface of the circuit 220c facing upwardly. A layer of protective organic material may have been previously deposited on the surface facing the circuit 220c. The deposit of the layer of dielectric material, usually a resin, may be performed using a full web coating or, preferably, serigraphy. The functionalities and the characteristics of the layer of dielectric material are also described in the Italian Patent Application number VI2012A000132.

Once the back-contact back-sheet has been completed, the assembly process of the photovoltaic module is performed as described with reference to FIGS. 1, 2a and 2b.

Still referring to FIGS. 1, 2a and 2b, a lower layer of encapsulating material 400, properly drilled, is aligned and applied to the inner surface of the back-contact back-sheet, i.e. to the surface comprising the connecting circuit 220c. The lower layer of encapsulating material 400 can be substituted by properly drilled multilayer structures, as described in the Italian Patent Applications VI2012A000133 and VI2012A000169. If the multilayer structure is used as a replacement of the lower layer of encapsulating material, then the layer of dielectric material, laid down on the inner surface of the back contact back sheet, is not necessary.

The cells are accordingly placed on the lower layer of encapsulating material 400 or on the multilayer structure properly drilled, after a drop of conductive paste 300 has been placed above each contact pad 222 in the conductive circuit 220c. The cells are placed on the lower layer of encapsulating material 400 or on the multilayer structure so that their electrodes 620 and 640 are electrically connected by means of the drops of conductive paste 300 to the contact pads 222 of the connecting circuit 220c.

The upper layer of encapsulating material 450, placed above the cells, and the upper protective layer 800 placed above the upper layer of encapsulating material 450, complete the stack. This stack is then laminated as described before so as to obtain the assembled photovoltaic module.

Although the present invention has been described with reference to the embodiments described above, it is clear for the skilled person that several modifications, variations and improvements of the present invention may be made, in view of the teaching described above and within the scope of the appended claims, without departing from the object and the scope of protection of the invention.

Moreover, those aspects which are deemed to be known by skilled person have not been described in order to not unduly obfuscate the described invention. Consequently, the invention is not limited by the embodiments described above but it is only limited by the scope of protection of the appended claims.

The invention claimed is:

1. Method for producing a back-contact back-sheet for a photovoltaic module comprising back-contact cells, said back-contact back-sheet comprising an outer face facing an air-side of said photovoltaic module and an inner face opposite said outer face and facing the inside of said photovoltaic module, said method comprising the steps of:
   providing a substrate having an outer surface facing the air-side of said photovoltaic module and coincident with said outer face of said back-contact back-sheet and an inner surface opposite said outer surface and facing the inside of said photovoltaic module;
   applying to said substrate a layer of electrically conductive material adapted to be formed as a connecting circuit to electrodes of the photovoltaic module, said application of said layer of electrically conductive material to said substrate being performed in such a way that said layer of electrically conductive material fixedly adheres to said inner surface of said substrate; and
   processing said layer of electrically conductive material so as to form said connecting circuit, said step of processing said layer of electrically conductive material comprising mechanically milling said layer of electrically conductive material to a depth so as not to damage the inner surface of said substrate, said processing being performed after said step of applying said layer of electrically conductive material to said substrate,
   forming a plurality of windows in said substrate of said back-contact back-sheet, said step of forming said plurality of windows being performed after said step of applying said layer of electrically conductive material onto said substrate, each of said windows being formed in a position of said substrate so as to leave exposed to the outside a predetermined portion of the surface of said layer of electrically conductive material facing said inner surface of said substrate.

2. Method according to claim 1, wherein said mechanical milling is performed by means of a gantry milling machine.

3. Method according to claim 1, wherein said mechanical milling is performed by means of a milling machine comprising one or more milling cutters, each of said one or more milling cutters having a diameter equal to the width of a trench to be formed in the layer of electrically conductive material so as to produce a pattern of which the connecting circuit is comprised.

4. Method according to claim 1, wherein said layer of electrically conductive material is applied onto said substrate in a form of a continuous sheet having a thickness between 25 µm and 70 µm, whose side surface does not form any indentations, trenches or meandering,
   whereby said layer of electrically conductive material is capable of being accurately mechanically milled.

5. Method according to claim 1, wherein said layer of electrically conductive material comprises copper or aluminum.

6. Method according to claim 1, wherein said substrate comprises at least one of the following materials: polyvinyl fluoride (PVF), polyethylene (PE), polyvinylidene fluoride (PVDF), polyethylene terephthalate (PET), polyethylene naphthalate (PEN).

7. Method according to claim 1, wherein said substrate of said back-contact back-sheet comprises:
   a first insulating layer of a first polymeric material having an outer surface facing the air-side of said photovoltaic module and an inner surface opposite said outer surface,
   an intermediate layer of a material impermeable to water vapor coupled to said inner surface of said first insulating layer, said intermediate layer having a lower surface facing said first insulating layer and an upper surface opposite said lower surface,
   a second insulating layer of a second polymeric material coupled to said upper surface of said intermediate layer.

8. Method according to claim 1 wherein said substrate comprises:
   an insulating portion comprising a lower surface facing the air-side of the photovoltaic module and substantially coincident with said outer surface of said substrate and an upper surface opposite said lower surface,
   a primer layer firmly fixed to said upper surface of said insulating portion, said primer layer comprising a lower surface facing said upper surface of said insulating portion and an upper surface opposite said lower surface of said primer layer and substantially coincident with said inner surface of said substrate.

9. Method according to claim 1, wherein said primer layer comprises at least one of the following materials: EVA, polyolefins, linear low density polyethylene (LLDPE), linear high density polyethylene (LHDPE), a thermo adhesive material such as, for example, acryl copolymers or polyurethanes loaded with additives, or acryl terpolymers grafted with maleic anhydride, or combinations of the previous materials.

10. Method according to claim 1, wherein said step of forming at least one of the windows of said plurality of windows is performed by means of milling, said inner face of said back-contact back-sheet facing and resting on a support plane during said milling performed with the aim of forming at least one of the windows of said plurality of windows in said substrate.

11. Method according to claim 10, wherein said step of forming said plurality of windows is performed by using the same milling apparatus as used for said step of processing said layer of electrically conductive material with the aim of forming said connecting circuit.

12. Method according to claim 10, wherein said step of forming at least one of said windows in said substrate of said back-contact back-sheet is performed so as to mill said substrate by a depth less than its thickness, in such a way that after milling a residual portion of said substrate is left on said surface of said layer of electrically conductive material facing said substrate.

13. Method according to claim 12, wherein said residual portion of said substrate is removed by means of laser ablation.

14. Method according to claim 12, wherein said residual portion of said substrate is removed by means of a cut into thin slices performed by using a laser beam, said cut into thin slices being followed by application of an air blow so as to remove said residual portion of said substrate cut into thin slices.

15. Method according to claim 1, wherein the apparatus used for performing said step of forming said plurality of windows by means of milling comprises a milling machine comprising one or more milling cutters, the position of at least one of said milling cutters along an axis normal to said support plane being adjusted by means of a closed-loop control system, said control system being adapted to measure the electrical resistance between said at least one of said milling cutters and said layer of electrically conductive material.

16. Method according to claim 1, wherein said step of forming at least one window of said plurality of windows is performed by means of laser ablation.

17. Method according to claim 1 further comprising the step of soldering or welding one or more interconnection terminals or busbars to said layer of electrically conductive material, said step of soldering or welding being performed after said step of forming said plurality of windows in said substrate of said back-contact back-sheet, each of said interconnection terminals or busbars being brought into contact with a predetermined portion of said layer of electrically conductive material through one of said windows formed in said substrate.

18. Method according to claim 17, wherein at least one of said busbars comprises aluminum.

19. Method according to claim 17, wherein said step of soldering or welding at least one of said one or more interconnection terminals or busbars to said layer of electrically conductive material comprises spot welding.

20. Method according to claim 17, wherein said step of soldering or welding at least one of said one or more interconnection terminals or busbars to said layer of electrically conductive material comprises ultrasonic welding.

21. Method of producing a photovoltaic module comprising back-contact cells, said method comprising the following steps performed in sequence:
   making a back-contact back-sheet according to claim 1;
   applying a lower encapsulating layer or a multi-layered structure, suitably pierced, onto said inner face of said back-contact back-sheet;
   applying one or more back-contact photovoltaic cells onto the surface of said lower encapsulating layer or of said multi-layered structure opposite the surface facing said inner face of said back-contact back-sheet, said step of applying said one or more photovoltaic cells being performed in such a way that said one or more photovoltaic cells are electrically connected to said connecting circuit of said back-contact back-sheet;
   applying an upper encapsulating layer onto the face of the photovoltaic cells opposite the face facing said lower encapsulating layer or said multi-layered structure; and
   applying an outer protective layer to the face of said upper encapsulating layer opposite the face facing said photovoltaic cells.

22. A method of making a photovoltaic module comprising the steps of:
   forming a back contact solar cell having a plurality of solar cell electrical contact points in a first predetermined arrangement;
   forming a continuous sheet of conductive material on an inner surface of an insulating substrate, the insulating substrate having an opposing outer surface;
   mechanically milling the sheet of conductive material to a depth so as not to damage the inner surface of the insulating substrate forming a plurality of connecting circuits;
   mechanically milling a plurality of windows in the opposing outer surface of the insulating substrate after said step of forming a continuous sheet of conductive material forming a plurality of openings through the insulating surface wherein each one of the plurality of opening ends adjacent a respective one of the plurality of connecting circuits;
   applying a conductive material to each of the plurality of connecting circuits, the conductive material applied in a second predetermined arrangement wherein the second predetermined arrangement of conductive material spatially matches the first predetermined arrangement of the plurality of solar cell electrical contact points;
   positioning the back contact solar cell adjacent the insulating substrate;
   aligning the first predetermined arrangement of the plurality of solar cell electrical contacts with the second predetermined arrangement of the conductive material wherein each of the plurality of solar cell electrical contacts electrically couples to a respective one of the plurality of connecting circuits;
   connecting a terminal to each one of the plurality of connecting circuits through a respective one of the plurality of windows milled in the opposing outer surface of the insulating substrate; and
   securing the back contact solar cell to the insulating substrate.

23. The method of making a photovoltaic module as in claim 22 further comprising the steps of:
   measuring an electrical resistance between a milling tool used in said step of mechanically milling the plurality of windows and a portion of the sheet of conductive material; and
   adjusting said step of mechanically milling the plurality of windows based on a resistance measured in said step of measuring the electrical resistance.

* * * * *